(12) United States Patent
Chang

(10) Patent No.: US 9,211,568 B2
(45) Date of Patent: Dec. 15, 2015

(54) CLEAN FUNCTION FOR SEMICONDUCTOR WAFER SCRUBBER

(71) Applicant: Taiwan Semiconductor Manufacturing Company Limited, Hsin-Chu (TW)

(72) Inventor: Yuan-Chang Chang, Hsinchu County (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 164 days.

(21) Appl. No.: 13/795,859

(22) Filed: Mar. 12, 2013

(65) Prior Publication Data

US 2014/0261537 A1   Sep. 18, 2014

(51) Int. Cl.
B08B 1/00 (2006.01)
H01L 21/67 (2006.01)

(52) U.S. Cl.
CPC .......... B08B 1/007 (2013.01); H01L 21/67046 (2013.01)

(58) Field of Classification Search
CPC .......... B08B 1/00; B08B 1/002; B08B 1/001; B08B 1/007; B08B 1/04; B08B 3/00; B08B 3/02; B08B 6/00; H01L 21/304; H01L 21/67046; H01L 21/67051
USPC ........ 15/1.51, 301, 302, 77, 88.2, 102; 134/3, 134/10, 21, 26, 28, 31, 32, 34, 37, 134/94.1–99.1, 104.1, 137, 140, 149, 151, 134/153, 157
See application file for complete search history.

(56) References Cited

U.S. PATENT DOCUMENTS

| | | | | |
|---|---|---|---|---|
| 4,569,695 A | * | 2/1986 | Yamashita et al. | 134/1 |
| 5,693,148 A | * | 12/1997 | Simmons et al. | 134/18 |
| 5,725,414 A | * | 3/1998 | Moinpour et al. | 451/41 |
| 5,991,965 A | * | 11/1999 | Stroh et al. | 15/310 |
| 6,418,584 B1 | * | 7/2002 | Teeny et al. | 15/102 |
| 6,711,775 B2 | | 3/2004 | Mikhaylich et al. | |
| 8,027,017 B2 | * | 9/2011 | Ryu et al. | 355/30 |
| 2002/0006767 A1 | * | 1/2002 | Wang et al. | 451/41 |
| 2002/0062843 A1 | * | 5/2002 | Hirooka et al. | 134/6 |
| 2005/0268408 A1 | * | 12/2005 | Chin | 15/1.51 |
| 2006/0213536 A1 | * | 9/2006 | Sato | 134/6 |
| 2006/0219260 A1 | * | 10/2006 | Iwami et al. | 134/6 |
| 2007/0093067 A1 | | 4/2007 | Chang et al. | |
| 2007/0251035 A1 | * | 11/2007 | Peng et al. | 15/77 |
| 2009/0158537 A1 | * | 6/2009 | Ishijima et al. | 15/1.51 |

(Continued)

FOREIGN PATENT DOCUMENTS

EP   764478   * 3/1997

*Primary Examiner* — Mark Spisich
(74) *Attorney, Agent, or Firm* — Cooper Legal Group, LLC

(57) ABSTRACT

Among other things, one or more techniques and systems for cleaning a scrub brush of a scrubber utilized in semiconductor fabrication are provided. In particular, a charge modification element, such as a base pH material or ammonia, is applied to the scrub brush to modify a charge of a particle on the scrub brush to a modified charge. The modified charge of the particle is similar to a charge of the scrub brush, such that the particle and the scrub brush repel one another. The particle can be detached from the scrub brush utilizing various techniques such as a de-ionized water technique or a mechanical cleaning bar technique. In this way, one or more particles can be detached from the scrub brush to clean the scrub brush of particles so that the scrub brush can be used to clean a semiconductor wafer.

17 Claims, 7 Drawing Sheets

(56) References Cited

U.S. PATENT DOCUMENTS

| | | | |
|---|---|---|---|
| 2011/0108056 A1* | 5/2011 | Ishizawa et al. | 134/1 |
| 2012/0285484 A1 | 11/2012 | Liu et al. | |
| 2013/0192634 A1* | 8/2013 | Huang et al. | 134/6 |

\* cited by examiner

CLEAN FUNCTION FOR SEMICONDUCTOR WAFER SCRUBBER

BACKGROUND

During semiconductor fabrication, particles can contaminate a semiconductor wafer, which can result in defects and reduced device yield from the semiconductor wafer. A scrubber can be used during fabrication to control particle contamination on the semiconductor wafer. The scrubber includes a scrub brush that is rotated across a surface of the semiconductor wafer, such as at 500 to 5000 rpms, to remove particles from the semiconductor wafer. When the particles become attached to the scrub brush the scrub brush can contaminate the next wafer. The contamination can cause defects during subsequent processing or scratch the semiconductor wafer. Periodically, an equipment engineer manually cleans the scrub brush or replaces the scrub brush, such as during a preventative maintenance (PM) cycle.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

One or more systems and techniques for cleaning a scrub brush of a scrubber utilized in semiconductor fabrication are provided herein. During semiconductor processing, particles, such as leftover chemicals, metal, etch by-products, or other material, can contaminant a semiconductor wafer being processed. A scrubber is used to clean a surface of the semiconductor wafer by brushing the surface with a scrub brush to remove particles from the surface during a wafer scrubbing cycle. In an example, the scrub brush has a scrub brush charge, such as a negative charge, which can be used to attract particles, such, as positively charged particles, from the semiconductor wafer to the scrub brush during cleaning of the semiconductor wafer. That is, a particle on a wafer that has a positive charge would be attracted to the negative scrub brush charge. Once the wafer scrubbing cycle is complete, the scrub brush is cleaned to remove the particles from the scrub brush so that the scrub brush is clean for a subsequent wafer scrubbing cycle of the next wafer. De-ionized water techniques and mechanical brushing techniques may, however, be inadequate for removing particles from the scrub brush due to forces attracting the particles to the scrub brush.

Accordingly, as provided herein, a charge modification element is applied to the scrub brush to modify the charge of the particle to a modified charge similar to the scrub brush charge. For example, the scrub brush and the particle will have a similar charge, such as a negative charge, which would cause the particle and the scrub brush to repel each other. In some embodiments, the charge modification element is a base pH material, ammonia, or other material capable of modifying a charge of a particle, such as a material capable of donating electrons to a particle to change the particle from a positive charge to a negative charge. In an example, an ammonia vapor is applied to the scrub brush such that one or more electrons are introduced to the particle on the scrub brush by the ammonia. In this way, the particle becomes a negatively charged particle having a negative charge that corresponds to the negative charge of the scrub brush. In an example, changing a pH of an aluminum oxide particle from about 3 to about 9 results in a charge of the aluminum oxide particle changing from about +20 mV to about −22 mV. In another example, changing a pH of a silicon nitride particle from about 4 to about 9 results in a charge of the silicon nitride particle changing from about +37 mV to about −40 mV.

In some embodiments, the scrub brush has a negative charge and a particle attached to the scrub brush also has a negative charge. The charge modification element is applied to the particle to increase the negative charge of the particle. In an example, changing a pH of a cerium oxide particle from about 7 to about 10 results in a charge of the cerium oxide particle changing from about −21 mV to about −58 mV. In another example, changing a pH of a silicon dioxide particle from about 5 to about 9 results in a charge of the silicon dioxide particle changing from about −20 mV to about −50 mV.

Various techniques can be used to remove the negatively charged particle from the scrub brush. In an example, a liquid, such as de-ionized water, can be applied to the scrub brush to detach the negatively charged particle. In another example, a mechanical cleaning bar can be used to mechanically brush the particle from the scrub brush, such as by rotating the mechanical cleaning bar while the scrub brush is plunged up and down against the rotating mechanical cleaning bar. In another example, the liquid and the mechanical cleaning bar can be used in combination to remove the particle from the scrub brush. In another example, vibration, a shaking motion, or other motion can be used, alone or in combination with a liquid, to remove the particle from the scrub brush. In this way, the scrub brush can be cleaned of particles during a particle detachment cycle performed during semiconductor fabrication.

The following description and annexed drawings set forth certain illustrative aspects and implementations. These are indicative of but a few of the various ways in which one or more aspects can be employed. Other aspects, advantages, and novel features of the disclosure will become apparent from the following detailed description when considered in conjunction with the annexed drawings.

DETAILED DESCRIPTION

Figure 1A:
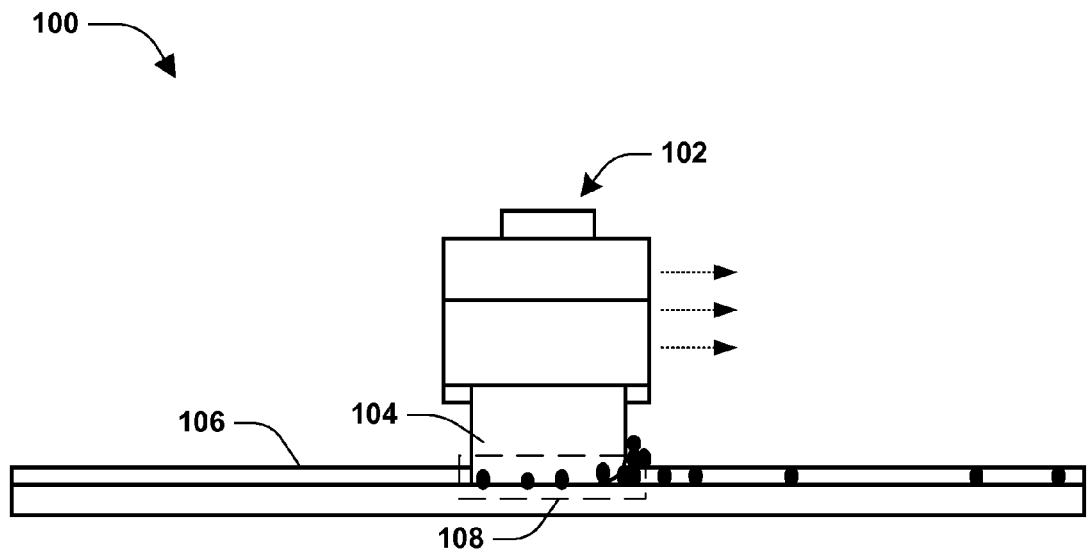
FIG. 1A is an illustration of a scrubber configured to remove particles from a semiconductor wafer during a wafer scrubbing cycle.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

FIG. 1A is an example 100 of a scrubber 102 configured to remove particles from a semiconductor wafer 106 having a dielectric film during a wafer scrubbing cycle. For example, the scrubber 102 has a scrub brush 104 that is brushed along a surface of the semiconductor wafer 106 in order to remove particles from the semiconductor wafer 106. For example, the wafer scrubbing cycle is performed during a back-end-of-line process, such as a wafer acceptance test. During the wafer scrubbing cycle, particles 108 can become attached to the scrub brush 104. In this way, the scrub brush 104 removes such particles 108 from the semiconductor wafer 106. In an example, the particles 108 can remain on the scrub brush 104 during subsequent wafer scrubbing cycles, which can induce defects into the semiconductor wafer 106 or a subsequently processed semiconductor wafer. For example, scrub brush 104 can scratch the surface of the semiconductor wafer 106 or leave particles on the semiconductor wafer 106 or on the next processed semiconductor wafer.

Figure 1B:
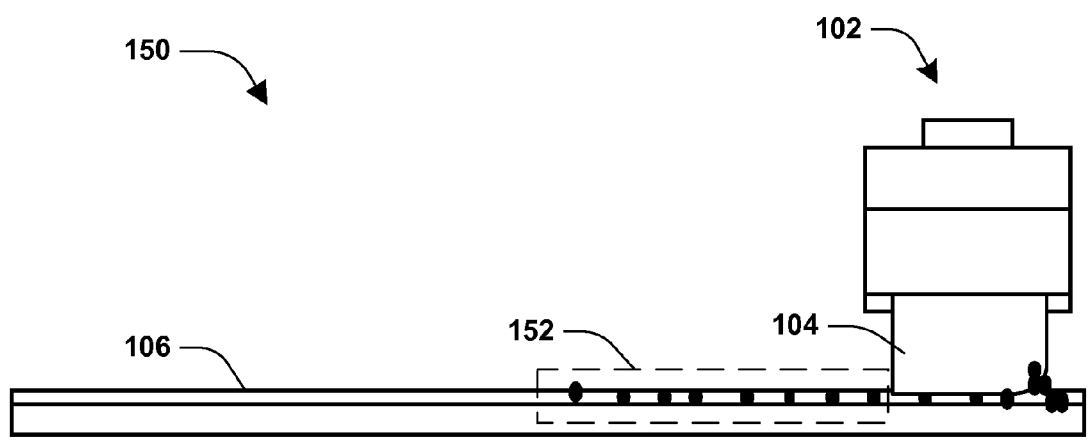
FIG. 1B is an illustration of a scrubber configured to remove particles from a semiconductor wafer during a wafer scrubbing cycle.

FIG. 1B is an example 150 of a scrubber 102 configured to remove particles from a semiconductor wafer 106 having a dielectric film during a wafer scrubbing cycle. The scrubber 102 has a scrub brush 104 that is brushed and/or rotated along a surface of the semiconductor wafer 106 in order to remove particles from the semiconductor wafer 106. For example, the scrub brush 104 can have a negative charge that is used to attract positively charged particles to the scrub brush 104 to remove such particles from the semiconductor wafer 106 during cleaning. In an example, particles, such as particles from the wafer scrubbing cycle illustrated in example 100 of FIG. 1A, are attached to the scrubber 102 from one or more wafer scrubbing cycles. During a subsequent wafer scrubbing cycle, particles 152 can be left behind on the semiconductor wafer 106 by the scrub brush 104. Because the scrub brush 104 can easily collector particles and can be relatively difficult to clean through automated processes due to attracting forces between particles and the scrub brush 104, the scrub brush 104 is manually cleaned or replaced during preventative maintenance.

Figure 2A:
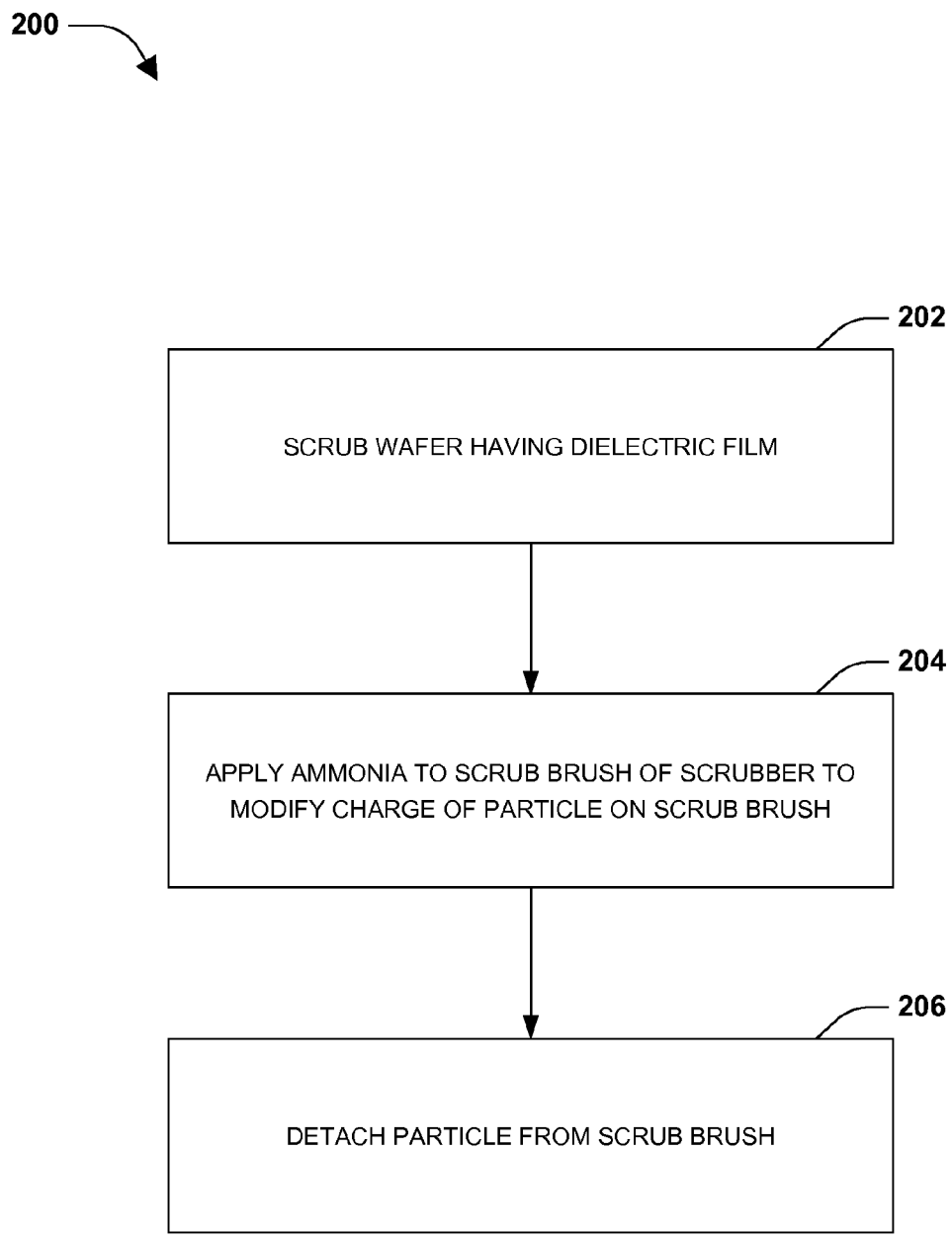
FIG. 2A is a flow diagram illustrating a method of cleaning a scrub brush of a scrubber utilized in semiconductor fabrication, according to some embodiments.

FIG. 2A is a diagram of a method 200 of cleaning a scrub brush 104 of a scrubber 102 utilized in semiconductor fabrication, according to some embodiments. At 202, performed wafer having a dielectric film is scrubbed, such as during a wafer scrubbing cycle. A particle detachment cycle 202 is performed upon completion of a wafer scrubbing cycle, such as the wafer scrubbing cycle of example 100 of FIG. 1A, because particles can become attached to the scrub brush 104 when the scrub brush 104 is brushed across a surface of a semiconductor wafer 106 during the wafer scrubbing cycle, as illustrated in example 150 of FIG. 1B. In some embodiments, the particle detachment cycle is performed when the scrub brush 104 is positioned within a brush pot or other location indicating completion of a wafer scrubbing cycle. Accordingly, the particle detachment cycle is performed to detach one or more particles from the scrub brush 104 to clean the scrub brush 104 for subsequent wafer scrubbing cycles.

In some embodiments of performing the particle detachment cycle, a charge modification element, such as ammonia or other base pH material, for example, is applied to the scrub brush 104 of the scrubber 102 such that the charge modification element modifies a charge of a particle on the scrub brush 104 to a modified charge similar to a scrub brush charge of the scrub brush 104, at 204. In an example, the scrub brush 104 has a negative charge and the particle has an initial positive charge. The difference in charge between the scrub brush 104 and the particle can result in a force that attracts the particle to the scrub brush 104, which can inhibit cleaning of the scrub brush 104. Accordingly, the charge modification element can be applied to the particle so that the charge of the particle becomes the modified charge, such as a negative charge. For example, ammonia is applied to the particle to modify the charge based upon the ammonia providing one or more electrons to the particle. In some embodiments, the scrub brush 104 and the particle have negative charges, such that the charge modification element is applied to the particle to increase the negative charge of the particle relative to the scrub brush 104. In this way, the particle and the scrub brush 104 have similar charges, thus causing the particle and the scrub brush 104 to repel each other.

In some embodiments, a particle has an initial positive charge that is modified by the charge modification element. In an example, changing a pH of an aluminum oxide particle from about 3 to about 9 results in a charge of the aluminum oxide particle changing from about +20 mV to about −22 mV. In another example, changing a pH of a silicon nitride particle from about 4 to about 9 results in a charge of the silicon nitride particle changing from about +37 mV to about −40 mV.

In some embodiments, a particle has an initial negative charge that is modified by the charge modification element. The charge modification element is applied to the particle to increase the negative charge of the particle. In an example, changing a pH of a cerium oxide particle from about 7 to about 10 results in a charge of the cerium oxide particle changing from about −21 mV to about −58 mV. In another example, changing a pH of a silicon dioxide particle from about 5 to about 9 results in a charge of the silicon dioxide particle changing from about −20 mV to about −50 mV.

At 206, the particle is detached from the scrub brush 104. In an example, de-ionized water is applied to the scrub brush 104 to detach the particle. In another example, the scrub brush 104 is rotated against a cleaning bar to detach the particle. In another example, the cleaning bar is rotated and the scrub brush 104 is plunged up and down against the rotating cleaning bar to detach the particle. In another example, the de-ionized water and the cleaning bar are used in combination to detach the particle. In another example, vibration, a shaking motion, or other motion can be used to remove the particle from the scrub brush 104. In this way, one or more particles can be detached from the scrub brush 104 to mitigate contamination of the semiconductor wafer 106 or a subsequently processed semiconductor wafer by the scrub brush 104 during subsequent wafer cleaning cycles. It will be appreciated that while merely a single particle is, at times, described herein, that the instant application including the scope of the appended claims is not to be so limited. For example, a single particle is merely referenced for ease of discussion, but multiple particles are able to be cleaned from a scrub brush according to the provisions set forth herein.

Figure 2B:
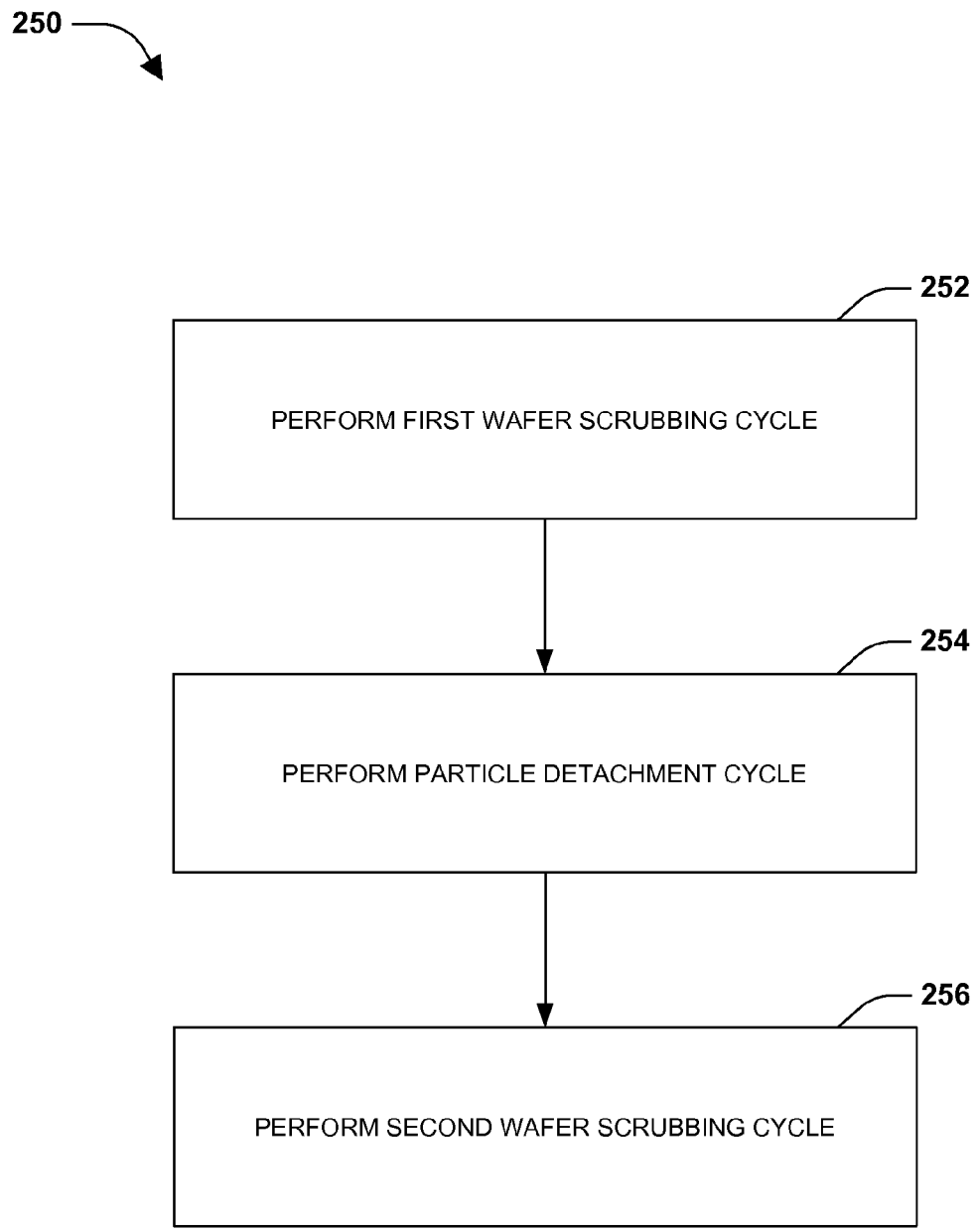
FIG. 2B is a flow diagram illustrating a method of performing a particle detachment cycle between a first wafer scrubbing cycle and a second wafer scrubbing cycle, according to some embodiments.

FIG. 2B is a diagram of a method 250 of performing a particle detachment cycle between a first wafer scrubbing cycle and a second wafer scrubbing cycle. That is, one or more semiconductor fabrication techniques, such as etching and chemical mechanical polishing, are performed upon a first semiconductor wafer, resulting in contamination of the first semiconductor wafer. At 252, a first wafer scrubbing cycle 252 is performed. For example, a chemical solution is applied to a surface of the first semiconductor wafer. The scrubber 102 has an initial negative charge. The scrubber 102 is positioned such that the scrub brush 104 contacts the surface of the first semiconductor wafer. In an example, the scrub brush 104 is brushed or rotated against the surface of the first semiconductor wafer. In another example, the first semiconductor wafer is rotated against the scrub brush 104. In another example, both the scrub brush and the wafer are rotated. In this way, the scrub brush 104 accumulates particles from the first semiconductor wafer in order to clean the first semiconductor wafer. For example, the scrub brush 104 can easily accumulate positively charged particles due to the initial negative charge of the scrubber 102.

At 254, a particle detachment cycle is performed. For example, the scrubber 102 is removed from contact with the first semiconductor wafer, such as being placed within a scrub brush pot located separate from the first semiconductor wafer. A charge modification element is applied to one or more particles attached to the scrub brush 104. In an example, the charge modification element increases a negative charge of a first particle. In another example, the charge modification element changes a positive charge of a second particle to a negative charge. Because the scrub brush 104 and one or more particles on the scrub brush have similar charges, the one or more particles can be detached from the scrub brush 104, for example, based upon a repelling force between the scrub brush 104 and the one or more particles. In an example, a liquid is sprayed against the scrub brush 104 to facilitate removal of one or more particles. In another example, a cleaning bar is mechanically rotated against the scrub brush to facilitate removal of one or more particles. In another example, the liquid and the cleaning bar are used to facilitate removal of one or more particles.

At 256, a second wafer scrubbing cycle is performed. In an example, a second semiconductor wafer is cleaned using the scrubber 102. Because one or more particles were removed from the scrub brush 104 during the particle detachment cycle at 254, the scrub brush 104 has a relatively low particle count. Because the scrub brush 104 has a relatively low particle count for the second wafer scrubbing cycle, the scrubber 102 can clean the second semiconductor wafer with a relatively decreased likelihood of scratching or inducing defects into the second semiconductor wafer. In some embodiments of the second wafer scrubbing cycle, the scrubber 102 is charged to a relatively negative charge so that particles, such as positively charged particles, are attracted to the scrub brush 104 to facilitate cleaning of the second semiconductor wafer. In an example, a second particle detachment cycle is performed after the second wafer scrubbing cycle to remove one or more particles from the scrub brush 104 for a subsequent wafer scrubbing cycle.

In some embodiments, a cleanliness test cycle is performed on the scrubber 102. For example, the scrub brush 104 is brushed against a cleanliness check wafer during the cleanliness test cycle. After the cleanliness test cycle, a particle count of the cleanliness check wafer is performed to determine a cleanliness of the scrub brush 104.

Figure 3A:
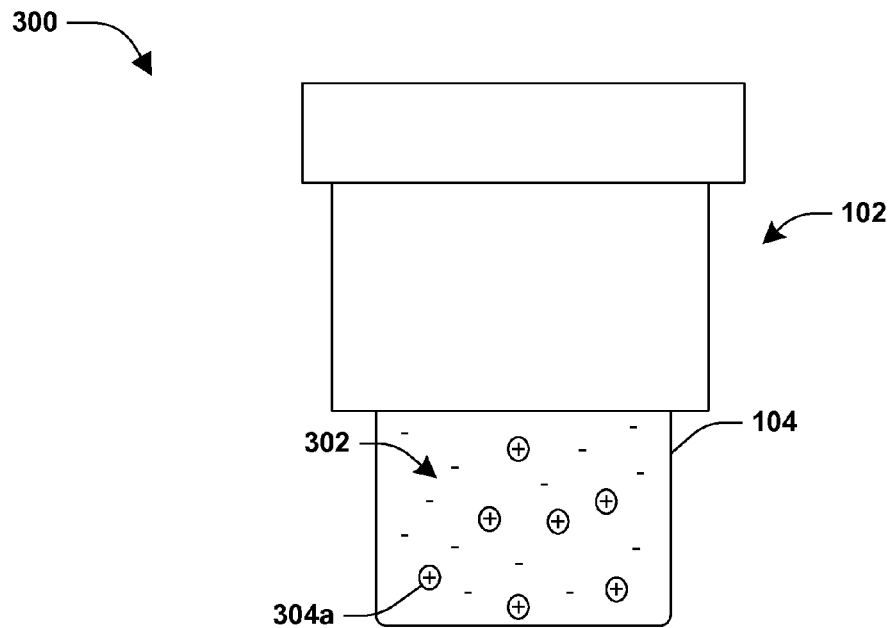
FIG. 3A is an illustration of a scrubber comprising a scrub brush, according to some embodiments.
Figure 3B:
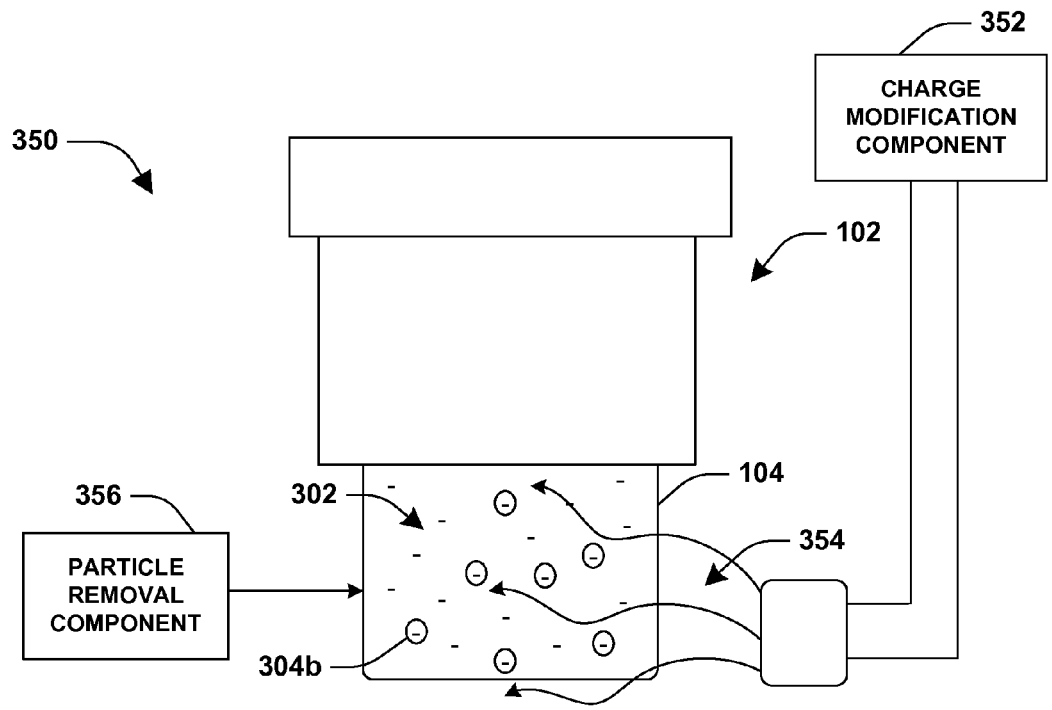
FIG. 3B is an illustration of a system configured for cleaning a scrub brush of a scrubber utilized in semiconductor fabrication, according to some embodiments.

FIG. 3A is an example 300 of a scrubber 102 comprising a scrub brush 104. In an example, the scrub brush 104 has a scrub brush charge 302, such as a negative charge. One or more particles, such as a positively charged particle 304a, may have a positive charge that is different than the negative charge of the scrub brush charge 302. The difference in charge results in an attractive force between such particles and the scrub brush 104, thus removing the particle from the wafer during the scrubbing process, but however inhibiting removal of particles from the scrub brush 104 during cleaning of the scrub brush 104. Accordingly, a charge modification element can be applied to the scrub brush 104 to modify a charge of the positively charged particle 304a, as illustrated in FIG. 3B. It is to be appreciated that a negatively charged scrub brush 104 and a positively charge particle 304a are merely used for illustrative purposes, and that the scrub brush 104 can have a positive charge and a particle can have a negative charge, such as a silicon particle or a cerium oxide particle, that result in an attractive force between the particle and the scrub brush 104, for example.

FIG. 3B is a scrubber system 350 for cleaning a partially fabricated semiconductor wafer, according to some embodiments. The scrubber system 350 comprises a scrub brush 104 of a scrubber 102. The scrubber system comprises a rotatable wafer support. The scrubber system 350 comprises a charge modification component 352 and a particle removal component 356. The charge modification component 352 is configured to apply a charge modification element 354 to a scrub brush 104 of a scrubber 102. In some embodiments, the charge modification element 354 is a vapor, a base pH material, ammonia, and/or other material capable of changing a charge of a particle. The charge modification element 354 modifies a charge of a particle, such as the positively charged particle 304a of FIG. 3A having an initial positive charge, to a modified charge. For example, the modified charge is a negative charge that results in a negatively charged particle 304b. The negative charge of the negatively charged particle 304b has a similar charge to scrub brush charge 302, such as a negative charge, of the scrub brush 104. In this way, the particle removal component 356 can detach the negatively charged particle 304b from the scrub brush 104 based upon the modified negative charge. That is, the particle removal component 356 can remove the negatively charged particle 304b because a force attracting the negatively charged particle 304b to the scrub brush 104 is reduced due to the similarity in charge between the negatively charged particle 304b and the scrub brush 104. For example, the particle removal component 356 can utilize liquid, air, vibration, vacuum air pressure, a cleaning bar, other methods, or combinations of these methods to remove the negatively charge particle 304b.

Figure 4:
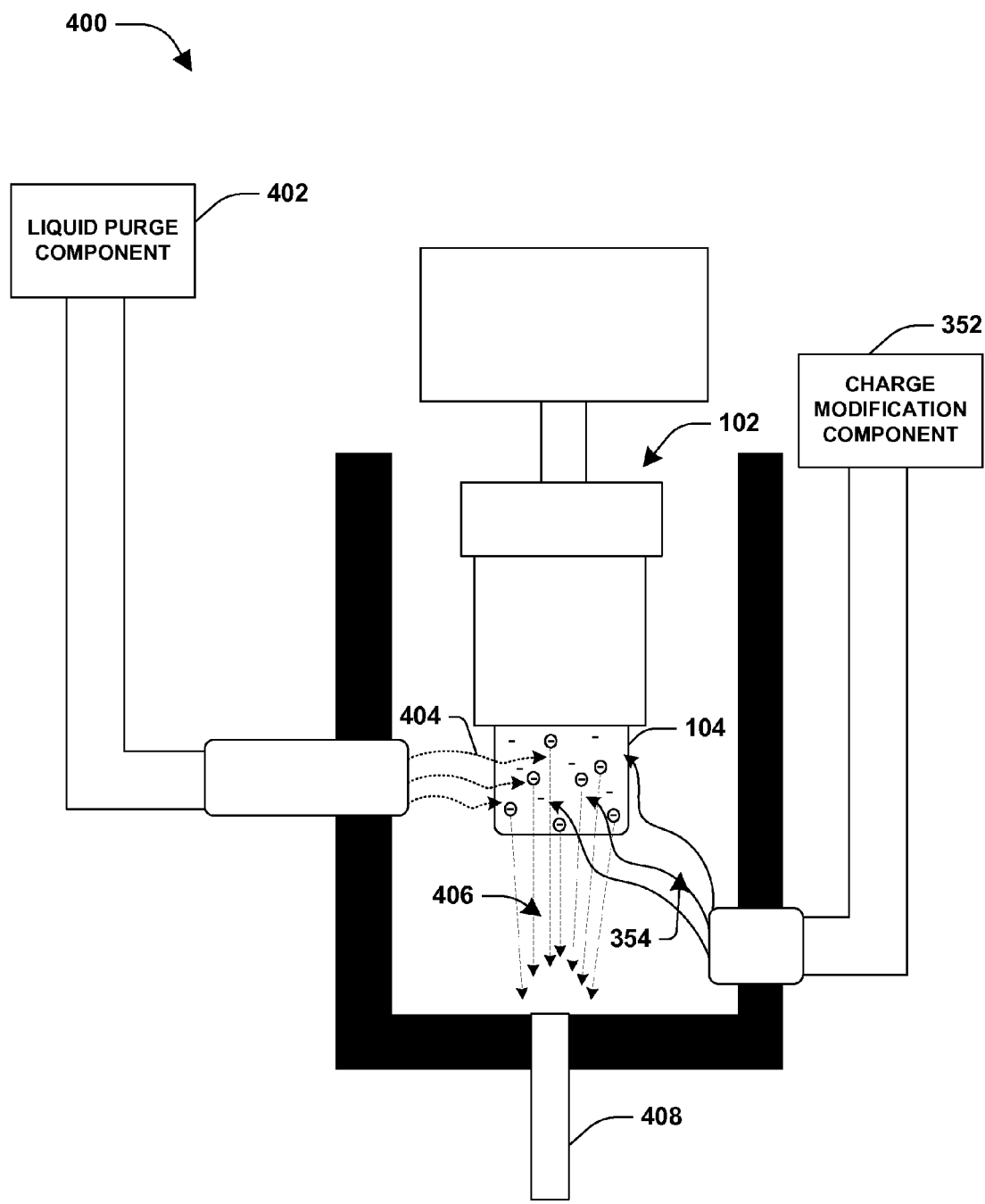
FIG. 4 is an illustration of a system configured for cleaning a scrub brush of a scrubber utilized in semiconductor fabrication, according to some embodiments.

FIG. 4 is a system 400 for cleaning a scrub brush 104 of a scrubber 102 utilized in semiconductor fabrication, according to some embodiments. The system 400 has a charge modification component 352 and a liquid purge component 402. The charge modification component 352 can apply a charge modification element 354, such as a base pH material, to the scrub brush 104 such that the charge modification element 354 modifies a charge of a particle on the scrub brush 104. In an example, the base pH material introduces one or more electrons to the particle resulting in a negatively charged particle. Thus, the negatively charged particle has a negative charge similar to a negative charge of the scrub brush 104. In this way, the negatively charged particle can be detached from the scrub brush 104 based upon a reduced force attracting the negatively charged particle to the scrub brush 104. For example, the liquid purge component 402 is configured to apply a liquid 404, such as de-ionized water, an alkaline material, bleach, sea water, baking soda, soap, or other liquid having a pH value greater than 7, for example, to the scrub brush 104 to detach 406 the negatively charged particle. For example, the liquid 404 is applied as an atmospheric vapor that substantially contacts the scrub brush 104 so that one or more particles on the scrub brush can receive electrons from the atmospheric vapor. The detached negatively charged particle can be removed through a drain 408 configured to receive particles from a brush pot within which the scrub brush 104 is cleaned. In this way, one or more particles can be removed from the scrub brush 104 to clean the scrub brush 104.

Figure 5:
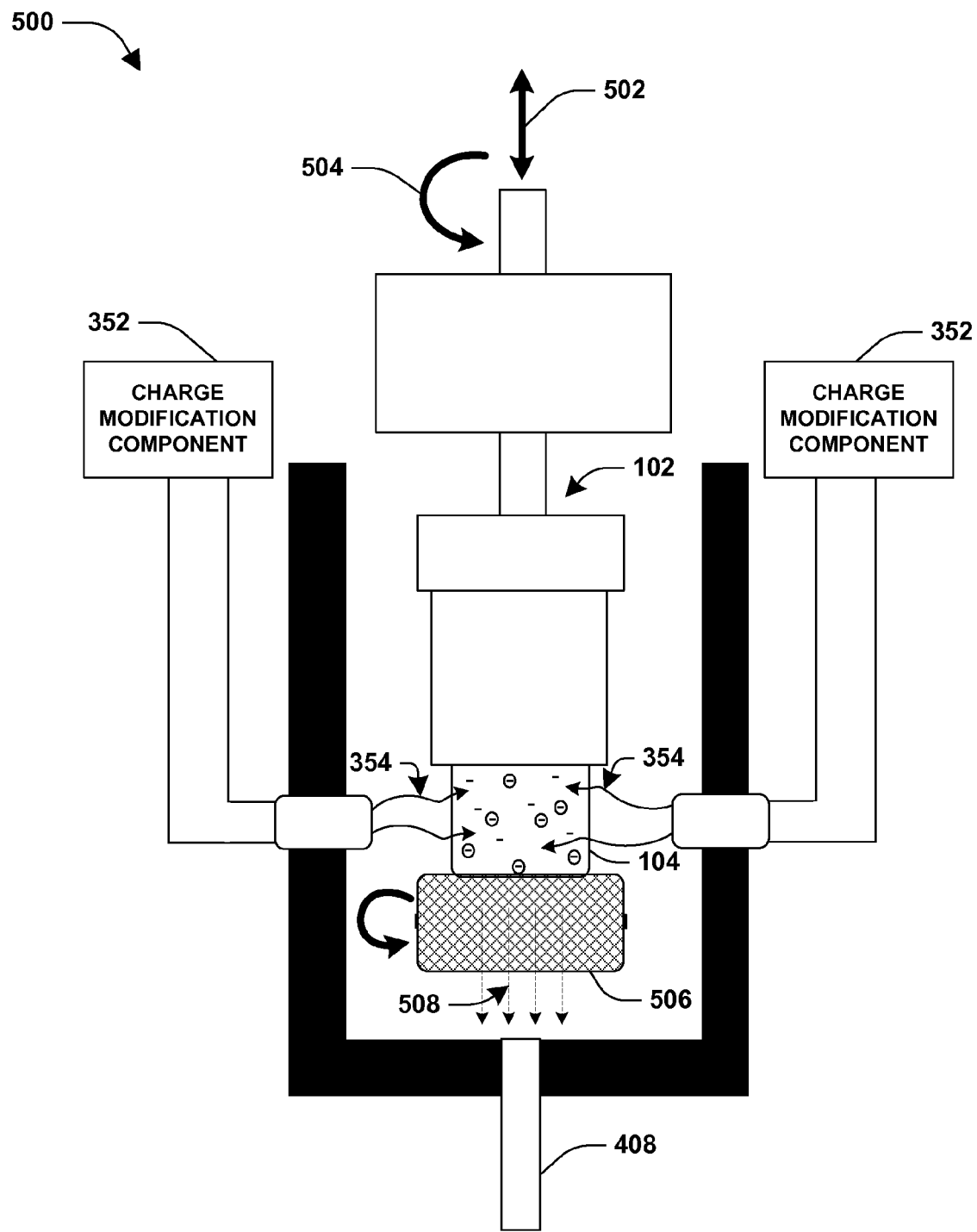
FIG. 5 is an illustration of a system configured for cleaning a scrub brush of a scrubber utilized in semiconductor fabrication, according to some embodiments.

FIG. 5 is a system 500 for cleaning a scrub brush 104 of a scrubber 102 utilized in semiconductor fabrication, according to some embodiments. The system 500 has a charge modification component 352 and a mechanical cleaning bar 506. The charge modification component 352 can apply a charge modification element 354, such as ammonia vapor, to the scrub brush 104 such that the charge modification element 354 modifies a charge of a particle on the scrub brush 104. In an example, the ammonia introduces one or more electrons to the particle resulting in a negatively charged particle having a negative charge similar to a negative charge of the scrub brush 104. In this way, the negatively charged particle can be detached from the scrub brush 104 due to a reduced force attracting the negatively charge particle to the scrub brush 104.

In an example of removing the negatively charged particle, the mechanical cleaning bar 506 is configured to detach 508 the negatively charged particle from the scrub brush 104 into a drain 408. The drain is configured to receive the detached negatively charged particle from a brush pot within which the scrub brush 104 is cleaned. In some embodiments, the mechanical cleaning bar 506 comprises a cleaning bar, such as a cleaning bar comprising quartz or polytetrafluoroethylene (PTFE). In an example, the scrub brush 104 is brushed against the mechanical cleaning bar 506 according to a rotation motion 504 relative to the mechanical cleaning bar 506. In another example, the scrub brush 104 is brushed against the mechanical cleaning bar 506 according to a lateral motion 502 or a plunging motion relative to the mechanical cleaning bar 506, for example. In another example, the mechanical cleaning bar 506 is rotated against the scrub brush 104. In another example, the mechanical cleaning bar 506 can be vibrated at ultrasonic, megasonic, or other frequencies. In this way, one or more particles can be removed from the scrub brush 104 to clean the scrub brush 104 of particles.

In some embodiments, the systems and techniques provided herein can reduce particles on the scrub brush 104 by about three times compared with other cleaning techniques. In one test, a cleaning technique that does not utilize the charge modification element can result in the scrub brush 104 having about 400 particles of 45 nm size or greater after about 25 wafer scrubs. In contrast, utilizing the charge modification element can result in the scrub brush 104 having a particle count (45 nm size or greater) of less than about 200 after about 25 wafer scrubs. In this way, fewer preventative maintenances (PMs) are performed to replace dirty brushes that result in relatively higher wafer fabrication system utilization.

Figure 6:
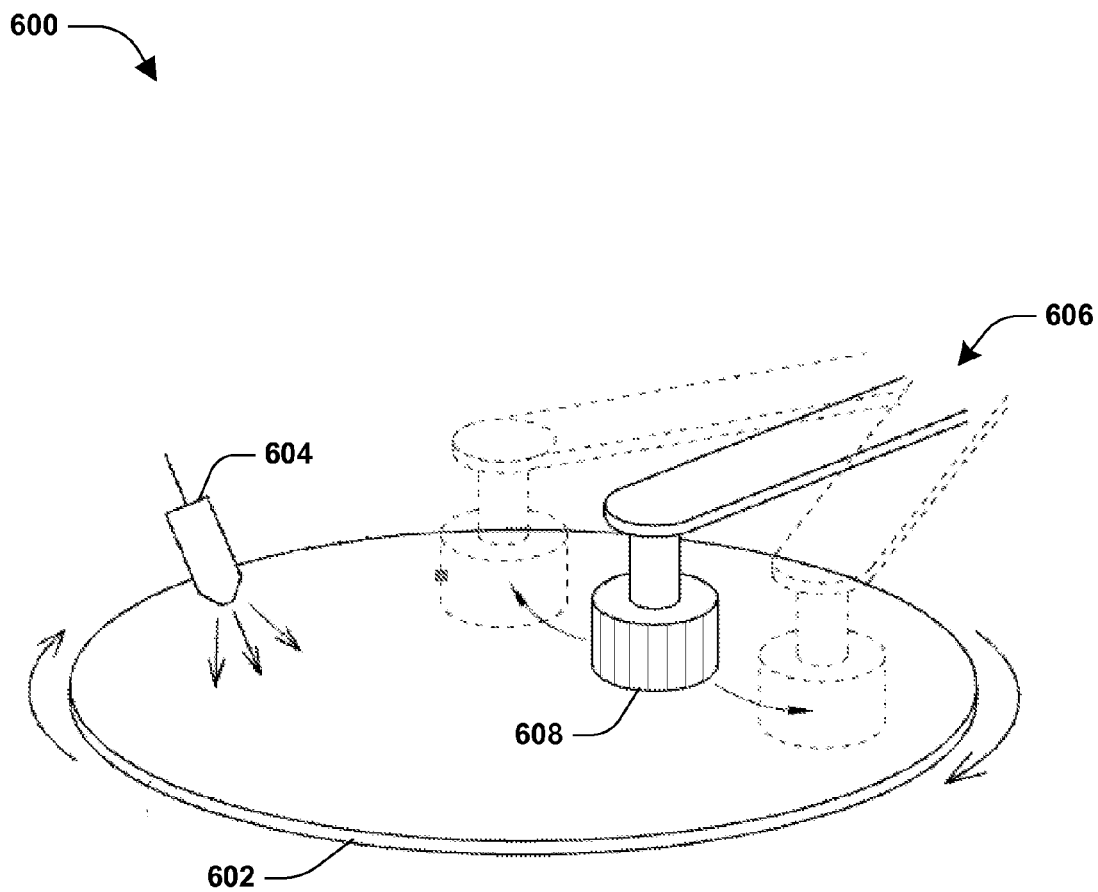
FIG. 6 is an illustration of a scrubber system configured to clean a semiconductor wafer.

FIG. 6 is a scrubber system 600 configured to clean a wafer 602 during a wafer scrubbing cycle. That is, the wafer 602 can become contaminated with particles from various semiconductor fabrication processing techniques, such as chemical mechanical polishing, etching, etc. The scrubber system 600 has a scrubber 606. The scrubber 606 has a scrub brush 608 that is in contact with the wafer 602 during the wafer scrubbing cycle. For example, the wafer 602 is rotated while the scrub brush 608 is brushed, such as side to side, across a surface of the wafer 602. In some embodiments, a chemical solution 604 is applied to the surface to facilitate cleaning of the wafer 602. In some embodiments, once the wafer scrubbing cycle is complete, the scrubber 606 is subjected to a particle detachment cycle that detaches one or more particles from the scrub brush 608 utilizing a charge modification element.

According to an aspect of the instant disclosure, a system for cleaning a scrub brush of a scrubber utilized in semiconductor fabrication is provided. The system has a charge modification component that can apply a charge modification element to a scrub brush of a scrubber. The charge modification element modifies a charge of a particle on the scrub brush to a modified charge similar to scrub brush charge of the scrub brush. For example, the charge modification element modifies the charge of the particle to a negative charge that is similar to a negative charge of the scrub brush. The particle can be detached from the scrub brush. The system has a particle removal component configured to detach the particle from the scrub brush based upon the modified charge, such as by de-ionized water or a mechanical cleaning bar.

According to an aspect of the instant disclosure, a scrubber system for cleaning a scrub brush of a scrubber utilized in semiconductor fabrication is provided. The system has a charge modification component that can apply a base pH material to a scrub brush of a scrubber. The base pH material introduces one or more electrons to a particle on the scrub brush, thus resulting in a negatively charged particle having a negative charge similar to a negative charge of the scrub brush. The system has a particle removal component configured to detach the negatively charged particle from the scrub brush based upon a force between the negatively charged particle and the negatively charged scrub brush.

According to an aspect of the instant disclosure, a method for using a scrubber system utilized in semiconductor fabrication is provided. The method comprises scrubbing a wafer having a dielectric film. Ammonia is applied to a scrub brush of a scrubber to modify a charge of a particle on the scrub brush to a modified charge. The particle is detached from the scrub brush based upon the modified charge.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A system for cleaning a scrub brush of a scrubber utilized in semiconductor fabrication, comprising:
    a brush pot into which a scrub brush of a scrubber is deposited comprising:
        an inlet connected to a source of a base pH material for modifying a charge of a particle on the scrub brush to a modified charge corresponding to a scrub brush charge of the scrub brush; and
        a rotatable cleaning bar configured to contact the scrub brush and rotate relative to the scrub brush to detach the particle from the scrub brush.

2. The system of claim 1, the base pH material comprising ammonia.

3. The system of claim 1, the base pH material comprising a vapor.

4. The system of claim 1, the rotatable cleaning bar configured to rotate about an axis parallel to a bottom surface of the brush pot.

5. The system of claim 1, the brush pot comprising:
    a second inlet connected to a de-ionized water source for supplying de-ionized water to purge the particle from the brush pot.

6. The system of claim 5, the brush pot comprising a drain through which the de-ionized water and the base pH material are purged from the brush pot.

7. The system of claim 1, the rotatable cleaning bar comprising at least one of quartz or polytetrafluoroethylene (PTFE).

8. The system of claim 1, the brush pot comprising:
    a drain configured to receive the particle detached from the scrub brush.

9. A scrubber system for cleaning a partially fabricated semiconductor wafer, comprising:
    a scrub brush having a negative charge; and
    a brush pot into which the scrub brush is deposited during a cleaning, the brush pot comprising:
        an inlet connected to a source of a base pH material, the base pH material introducing one or more electrons to a particle on the scrub brush resulting in the particle having a negative charge; and
        a cleaning bar configured to contact the scrub brush and vibrate within the brush pot to detach the particle having the negative charge from the scrub brush based upon a force between the particle and the negative charge of the scrub brush.

10. The scrubber system of claim 9, the base pH material comprising an ammonia vapor.

11. The scrubber system of claim 9, the brush pot comprising:
    a second inlet connected to a de-ionized water source for purging the particle from the brush pot.

12. A scrubber system for cleaning a partially fabricated semiconductor wafer, comprising:
    a scrub brush configured to scrub a partially fabricated semiconductor wafer to remove particles from the partially fabricated semiconductor wafer; and
    a brush pot for cleaning the scrub brush, the brush pot comprising:
        an inlet connected to a source of a base pH material, the base pH material modifying a charge of a particle attracted to the scrub brush while scrubbing the partially fabricated semiconductor wafer; and
        a cleaning bar configured to contact the scrub brush and rotate about an axis parallel to a bottom surface of the brush pot.

13. The scrubber system of claim 12, the brush pot comprising:
    a second inlet connected to a de-ionized water source for supplying de-ionized water to purge the particle from the brush pot.

14. The scrubber system of claim 12, the cleaning bar configured to brush the particle from the scrub brush.

15. The scrubber system of claim 12, the base pH material comprising ammonia.

16. The scrubber system of claim 12, the base pH material comprising ammonia vapor.

17. The scrubber system of claim 12, the brush pot comprising a drain through which the base pH material is purged from the brush pot.

* * * * *